(12) United States Patent
Yudovsky

(10) Patent No.: US 10,192,770 B2
(45) Date of Patent: Jan. 29, 2019

(54) SPRING-LOADED PINS FOR SUSCEPTOR ASSEMBLY AND PROCESSING METHODS USING SAME

(71) Applicant: Applied Materials, Inc., Santa Clara, CA (US)

(72) Inventor: Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 129 days.

(21) Appl. No.: 14/505,809

(22) Filed: Oct. 3, 2014

(65) Prior Publication Data

US 2016/0099166 A1 Apr. 7, 2016

(51) Int. Cl.
| C23C 16/458 | (2006.01) |
| H01L 21/687 | (2006.01) |
| H01L 21/683 | (2006.01) |

(52) U.S. Cl.
CPC .... H01L 21/68742 (2013.01); H01L 21/6838 (2013.01); H01L 21/68764 (2013.01); H01L 21/68771 (2013.01); H01L 21/68785 (2013.01); *C23C 16/4586* (2013.01)

(58) Field of Classification Search
USPC ............... 118/728–732; 156/345.51–345.55
See application file for complete search history.

(56) References Cited

U.S. PATENT DOCUMENTS

| 4,245,698 A * | 1/1981 | Berkowitz ............ C22C 19/055 148/410 |
| 4,790,258 A * | 12/1988 | Drage ............... H01L 21/68742 118/500 |
| 5,186,718 A | 2/1993 | Tepman et al. |
| 5,823,153 A | 10/1998 | Santi et al. |
| 6,032,691 A * | 3/2000 | Powell ................. F16L 29/04 137/614.03 |
| 6,148,762 A * | 11/2000 | Fukuda ............... C23C 16/4581 118/715 |
| 6,389,677 B1 * | 5/2002 | Lenz ................... H01L 21/6831 269/13 |
| 6,550,484 B1 * | 4/2003 | Gopinath .......... H01L 21/67126 134/1.2 |
| 6,887,317 B2 * | 5/2005 | Or ....................... C23C 16/4401 118/500 |
| 7,160,392 B2 | 1/2007 | Shang et al. |

(Continued)

FOREIGN PATENT DOCUMENTS

| JP | S61-214937 | 9/1986 |
| KR | 10-2009-0132335 | 12/2009 |

OTHER PUBLICATIONS

PCT International Search Report and Written Opinion in PCT/US2015/053529, dated Dec. 28, 2015, 14 pages.

(Continued)

*Primary Examiner* — Parviz Hassanzadeh
*Assistant Examiner* — Tiffany Z Nuckols
(74) *Attorney, Agent, or Firm* — Servilla Whitney LLC

(57) ABSTRACT

Apparatus and methods for processing a semiconductor wafer including a susceptor assembly with recesses comprising at least three lift pins. The lift pins include a sleeve with a spring and pin positioned therein. The spring and pin elevate the wafer to a position where the wafer can be pre-heated and, upon compression, lowers the wafer to a processing position.

16 Claims, 10 Drawing Sheets

(56) References Cited

U.S. PATENT DOCUMENTS

| | | | |
|---|---|---|---|
| 7,180,283 B2* | 2/2007 | Hunger | H01L 21/68742 414/389 |
| 7,187,188 B2 | 3/2007 | Andrews et al. | |
| 7,292,428 B2 | 11/2007 | Hanawa et al. | |
| 8,230,931 B2 | 7/2012 | Rodriguez et al. | |
| 2005/0000453 A1 | 1/2005 | Hwang et al. | |
| 2007/0089672 A1* | 4/2007 | Shimamura | C23C 8/00 118/504 |
| 2010/0212832 A1* | 8/2010 | Wakasaki | B65G 49/064 156/345.43 |
| 2011/0287631 A1* | 11/2011 | Yamamoto | H01J 37/32568 438/710 |
| 2013/0230814 A1 | 9/2013 | Dunn et al. | |
| 2013/0333616 A1 | 12/2013 | Klindworth et al. | |
| 2014/0097175 A1 | 4/2014 | Yu et al. | |

OTHER PUBLICATIONS

PCT International Preliminary Report on Patentability in PCT/US2015/053529 dated Apr. 13, 2017, 11 pages.

* cited by examiner

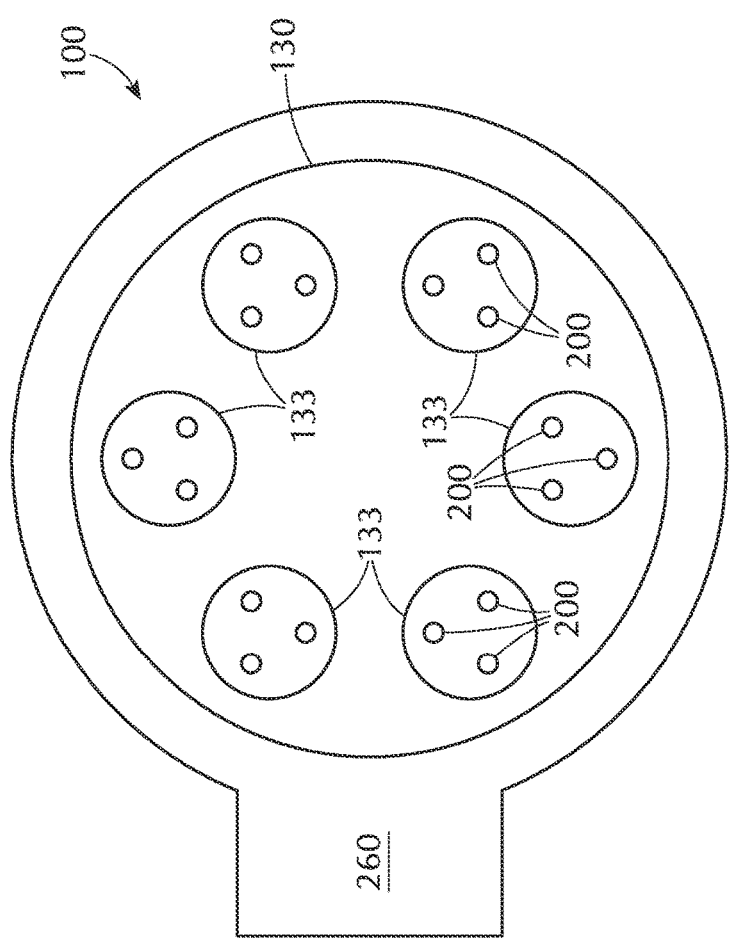

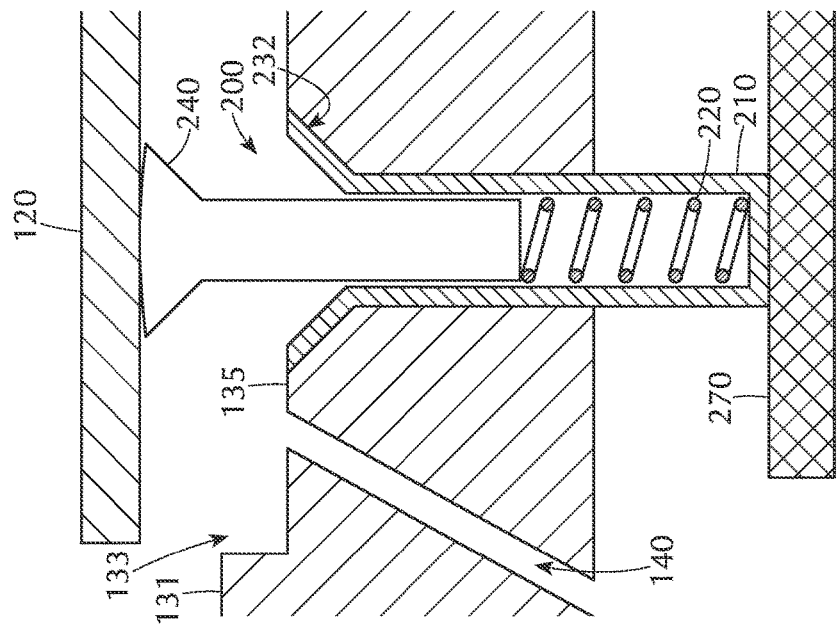
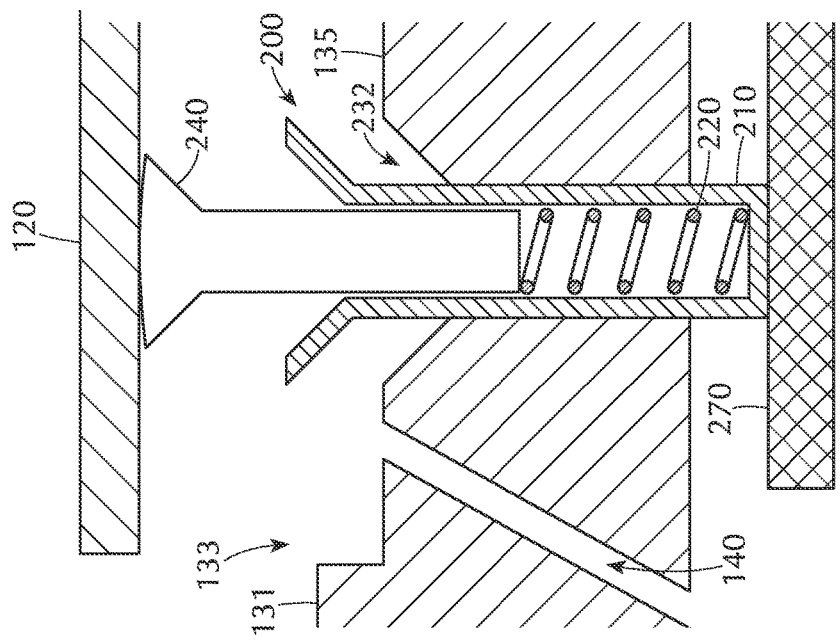

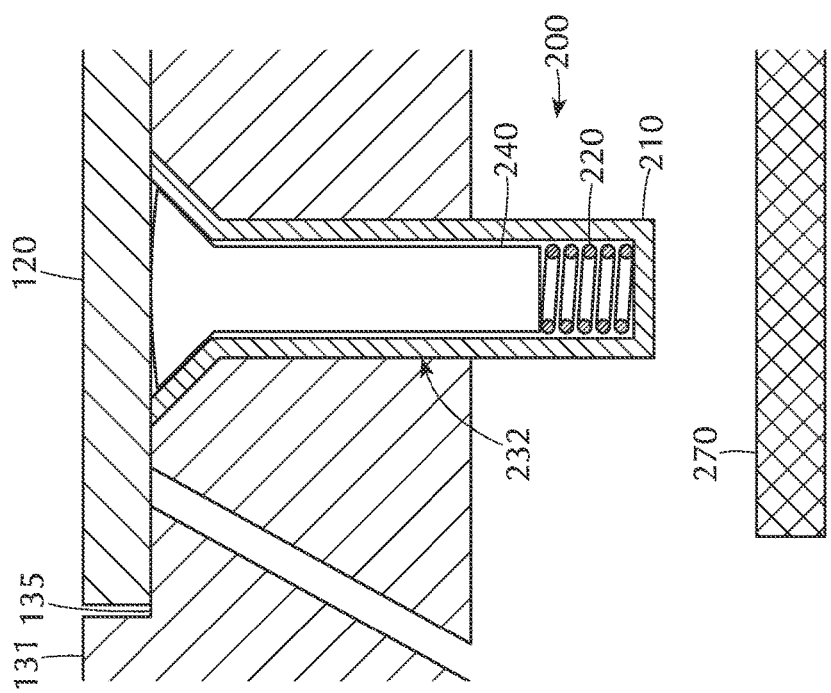

SPRING-LOADED PINS FOR SUSCEPTOR ASSEMBLY AND PROCESSING METHODS USING SAME

BACKGROUND

Embodiments of the invention generally relate to apparatus and methods of holding a substrate during processing. In particular, embodiments of the invention are directed to lift pins for loading and unloading wafers from a processing chamber and methods of use.

In some CVD and ALD processing chambers, the substrates, also referred to herein as wafers, move relative to the precursor injector and heater assembly. If the motion creates acceleration forces larger than that of the frictional force, the wafer can become displaced causing damage or related issues. The wafers placed off-axis can slip at high acceleration/deceleration on a moving/rotating susceptor. Friction from the weight of the wafer itself is insufficient to hold the wafer on tools where higher throughput is sought.

To prevent the rotational forces from dislodging the wafer during process, additional hardware to clamp or chuck the wafer in place may be needed. For example, vacuum chucking may be incorporated into susceptor to provide negative pressure to the bottom surface of a wafer.

In single wafer processing chambers, wafers often preheat while resting on lift pins before being loaded into the susceptor recess. In carousel processing chambers, the preheating occurs at a loading position because the susceptor rotates. This process takes time and results in delays in indexing and loading of the next wafer. The susceptor of a carousel processing chamber has to stop rotation for an extended period of time to load each wafer. This delay in processing is cumulative and can result in large amounts of lost time.

Therefore, there is a need in the art for apparatus and methods to increase the wafer loading speed and shorten the delay for wafer pre-heating in processing chambers.

SUMMARY

One or more embodiments of the invention are directed to susceptor assemblies. The susceptor assembly comprises a susceptor having a susceptor body and a top surface with at least one recess therein. Each recess has a bottom surface. At least three lift pins are positioned within each recess. Each lift pin comprises a sleeve, a spring and a pin. The sleeve has an elongate body with a top end, bottom, sides and an elongate axis and is positioned within an opening in the bottom surface of the recess. The spring is positioned within the elongate body of the sleeve adjacent to the bottom of the sleeve. The pin is positioned within the elongate sleeve in contact with the spring. The pin is movable along the elongate axis of the sleeve so that a top surface of the pin can extend above the top end of the sleeve.

Additional embodiments of the invention are directed to susceptor assemblies. The susceptor assembly comprises a susceptor with a susceptor body and a top surface. There is at least one recess in the top surface. Each recess has a bottom surface. At least three lift pins are positioned within each recess. Each lift pin comprises a cylindrical sleeve, a spring and a cylindrical pin. The cylindrical sleeve has an elongate body with a top end, bottom, sides and an elongate axis and is positioned within an opening in bottom surface of the recess. The spring comprises a high temperature material and is positioned within the elongate body of the cylindrical sleeve adjacent the bottom of the cylindrical sleeve. The cylindrical pin is positioned within the elongate cylindrical sleeve in contact with the spring. The cylindrical pin has an outer diameter that is smaller than in inner diameter of the elongate cylindrical sleeve. The cylindrical pin is movable along the elongate axis of the cylindrical sleeve so that a top surface of the cylindrical pin can extend above the top end of the cylindrical sleeve. The spring has a spring constant sufficient to allow a wafer resting on the cylindrical pin to be elevated when no vacuum is applied and to contract so that the wafer rests on the bottom surface of the recess when a vacuum is applied. A vacuum source is in fluid communication with the recess in the susceptor.

Further embodiments of the invention are directed to processing methods. A susceptor assembly comprising a plurality of recesses is rotated to position a recess adjacent a loading area of a processing chamber. A wafer is positioned on at least three lift pins positioned within the recess. Each lift pin comprises an elongate sleeve with a spring and a pin therein so that the pin rests on the spring so that without applying a vacuum to the recess, the wafer is elevated above a bottom surface of the recess. The susceptor assembly is repeatedly rotated to position a recess adjacent the loading area and wafers are repeatedly positioned onto at least three lift pins in the recess until a predetermined number of wafers have been loaded into the processing chamber. A vacuum is applied to the plurality of recesses to compress the springs so that each of the wafers is lowered to rest on the bottom surface of the recess.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. The appended drawings illustrate only typical embodiments of this invention and are therefore not to be considered limiting of the scope of the invention, for the invention may admits to other equally effective embodiments.

FIG. 10 shows a schematic view of a processing chamber in accordance with one or more embodiments of the disclosure; and FIGS. 11A through 11C show partial cross-sectional views of a susceptor assembly and process sequence in accordance with one or more embodiments of the disclosure.

To facilitate understanding, identical reference numerals have been used, where possible, to designate identical elements that are common to the figures. It is contemplated that elements and features of one embodiment may be beneficially utilized in other embodiments without further recitation.

DETAILED DESCRIPTION

Figure 1:
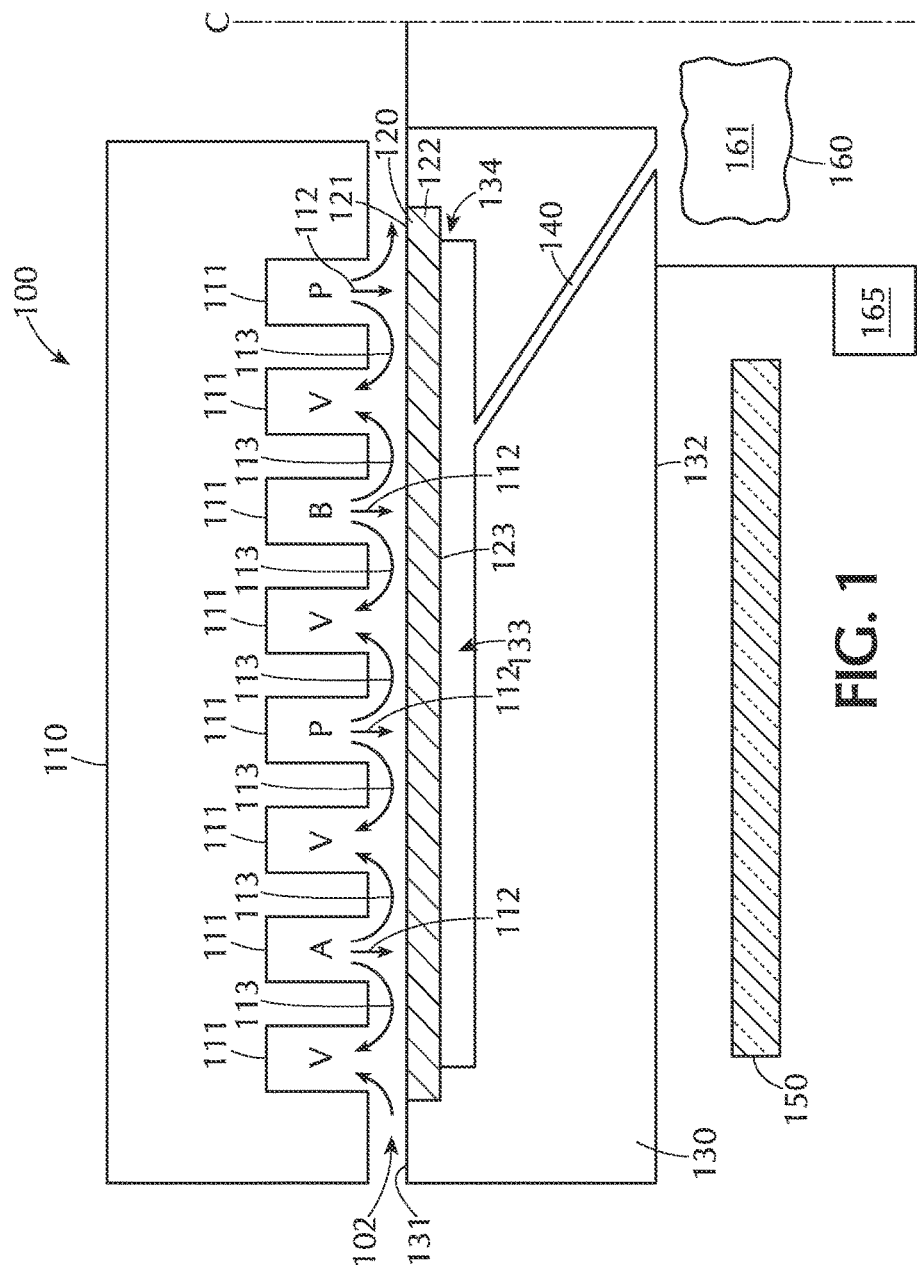
FIG. 1 shows partial cross-sectional view of a processing chamber in accordance with one or more embodiment of the disclosure.

Embodiments of the invention provide methods and apparatus capable of keeping a wafer in position during processing to prevent accidental damage to the wafer and hardware. Specific embodiments of the invention are directed to apparatus and methods for creating a differential pressure developed from a unique precursor injector design with a magnitude sufficient to hold wafers in place at high rotation speeds. As used in this specification and the appended claims, the terms "wafer", "substrate" and the like are used interchangeably. In some embodiments, the wafer is a rigid, discrete substrate.

In some spatial ALD chambers, the precursors used for deposition are injected in close proximity to the wafer surface. To develop the gas dynamics, the injector channels are independently controlled at a higher pressure than the surrounding chamber. By creating a pressure differential between the front side of the wafer and the back side of the wafer, a positive pressure force adequate to hold the wafer against relativity larger acceleration force can be generated.

In some embodiments, differential pressure is used to hold substrates (wafers) on a susceptor under large acceleration forces. The large acceleration forces occur as a result of high rotation speeds, which may be experienced in carousel-type processing chambers, from larger batch sizes and processing speeds or higher reciprocating motion for higher wafer throughput.

In some embodiments, the wafers sit in shallow pockets on a susceptor below the injector assemblies. The susceptor can provide heat transfer, improved gas dynamics and act as a carrier vehicle for the substrates.

In some embodiments, susceptors may include an angled hole for vacuum from inner diameter of susceptor-bottom up to the wafer pocket. The susceptor can get a vacuum source through the rotation shaft and rotation motor below the shaft.

Some embodiments of the disclosure are directed to susceptors with pins that hold a wafer at a preheat distance after the wafer moves from the wafer exchange position. In a susceptor with a vacuum chuck, it is possible to use spring-loaded pins. The spring stiffness is sufficient to hold the wafer weight, but will collapse when the vacuum chuck is engaged.

In some embodiments, the lift pins have two parts with a spring between them. The external pin (sleeve) slides in the pin hold in the susceptor. The inner pin sits inside of the external pin (sleeve). During wafer exchange, the pin assembly behaves similar to a conventional pin. But when recessed in a pocket, the inner pin sticking provides some gap between the wafer and the susceptor. All the wafers could be loaded without touching the pocket. When the last wafer is loaded and has been heated, the vacuum chuck can be engaged and the wafers go into the recesses. The last one or two wafers may be pre-heated outside of the chamber to shorten the loading time. In some embodiments, the spring-loaded pins are positioned within a recess in the susceptor assembly. In some embodiments, the spring-loaded pins are not positioned in a recessed portion of the susceptor.

FIG. 1 shows a portion of a processing chamber 100 in accordance with one or more embodiments of the invention. The processing chamber 100 includes at least one gas distribution assembly 110 to distribute the reactive gases to the chamber. The embodiment shown in FIG. 1 has a single gas distribution assembly 110, but those skilled in the art will understand that there can be any suitable number of gas distribution assemblies. There can be multiple assemblies with spaces between each assembly, or with practically no space between. For example, in some embodiments, there are multiple gas distribution assemblies 110 positioned next to each other so that the wafer 120 effectively sees a consistent repetition of gas streams.

Figure 2:
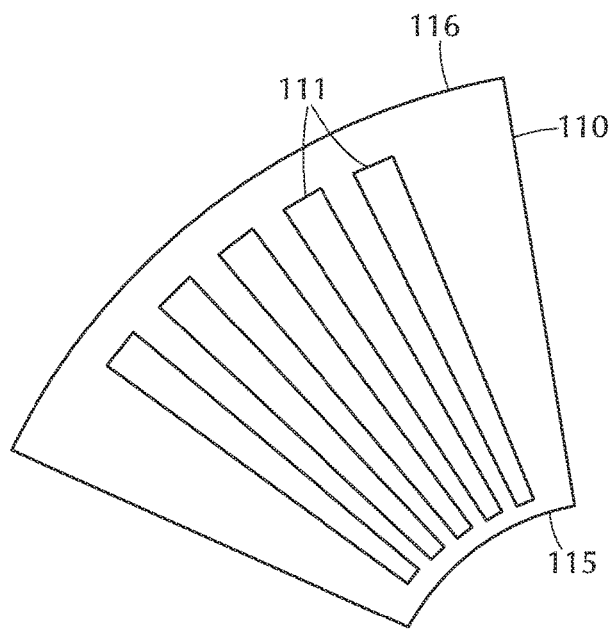
FIG. 2 shows a view of a portion of a gas distribution assembly in accordance with one or more embodiment of the disclosure.

While various types of gas distribution assemblies 110 can be employed (e.g., showerheads), for ease of description, the embodiment shown in FIG. 1 shows a plurality of substantially parallel gas channels 111. As used in this specification and the appended claims, the term "substantially parallel" means that the elongate axis of the gas channels 111 extend in the same general direction. There can be slight imperfections in the parallelism of the gas channels 111. However, those skilled in the art will understand that a carousel-type processing chamber may rotate the wafers about a central axis offset from the central axis of the wafer. In this configuration, gas channels 111 that are not substantially parallel may be useful. Referring to FIG. 2, the gas distribution assembly 110 may be a pie-shaped segment in which the gas channels 111 extend from in inner edge 115 of the pie-shape toward the outer edge 116 of the pie-shape. The shape of the gas channels 111 can also vary. In some embodiments, the gas channels 111 have a substantially uniform width along the length of the channel extending from the inner edge 115 to the outer edge 116. In other embodiments, the width of the gas channel 111 increases along the length of the channel extending from the inner edge 115 to the outer edge 116. This is shown in FIG. 2, where the gas channels 111 have a smaller width at the inner edge 115 and a wider width at the outer edge 116. The aspect ratio of this change in width, in accordance with some embodiments, may be equal to the radial difference in position so that the edges of each channel extend from the same point. This may result in all point of a wafer passing beneath the gas channels having about equal residence time. Stated differently, each channel width may change as a function of the distance from center of the susceptor rotation.

Referring back to FIG. 1, the plurality of gas channels 111 can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface 121 of the wafer 120. This flow is shown with arrows 112. Some of the gas flow moves horizontally across the surface 121 of the wafer 120, up and out of the processing region through the purge gas P channel(s), shown with arrows 113. A substrate moving from the left to the right will be exposed to each of the process gases in turn, thereby forming a layer on the substrate surface. The substrate can be in a single wafer processing system in which the substrate is moved in a reciprocating motion beneath the gas distribution assembly, or on a carousel-type system in which one or more substrates are rotated about a central axis passing under the gas channels.

A susceptor assembly 130 is positioned beneath the gas distribution assembly 110. The susceptor assembly 130 includes a top surface 131, a bottom surface 132 and at least one recess 133 in the top surface 131. The recess 133 can be any suitable shape and size depending on the shape and size of the wafers 120 being processed. In the embodiment shown the recess 133 has two step regions 134 around the outer peripheral edge of the recess 133. These steps 134 can be sized to support the outer peripheral edge 122 of the wafer 120. The amount of the outer peripheral edge 122 of the wafer 120 that is supported by the steps 134 can vary depending on, for example, the thickness of the wafer and the presence of features already on the back side 123 of the wafer.

In some embodiments, the recess 133 in the top surface 131 of the susceptor assembly 130 is sized so that a wafer 120 supported in the recess 133 has a top surface 121 substantially coplanar with the top surface 131 of the susceptor assembly 130. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The bottom 135 of the recess has at least one passage 140 extending through the susceptor assembly 130 to the drive shaft 160 of the susceptor assembly 130. The passage(s) 140 can be any suitable shape and size and forms a fluid communication between the recess 133 and the drive shaft 160. The drive shaft 160 can be connected to a vacuum source 165 which forms a region of decreased pressure (referred to as a vacuum) within a cavity 161 of the drive shaft 160. As used in this specification and the appended claims, the term "vacuum" used in this context means a region having a lower pressure than the pressure of the processing chamber. There is no need for there to be an absolute vacuum. In some embodiments, the vacuum, or region of decreased pressure has a pressure less than about 50 Torr, or less than about 40 Torr, or less than about 30 Torr, or less than about 20, Torr, or less than about 10 Torr, or less than about 5 Torr, or less than about 1 Torr, or less than about 100 mTorr, or less than about 10 mTorr.

The cavity 161 can act as a vacuum plenum so that if there is a loss of external vacuum, the vacuum within the cavity 161 can remain at decreased pressure. The passage 140 is in communication with the cavity 161 so that the vacuum within the cavity 161 can draw on the back side 123 of the wafer 120 through the passage 140.

With a vacuum, or partial vacuum, in the recess 133 below the wafer 120, the pressure in the reaction region 102 above the wafer 120 is greater than the pressure in the recess 133. This pressure differential provides sufficient force to prevent the wafer 120 from moving during processing. In one or more embodiments, the pressure in the recess 133 below the wafer 120 is lower than the pressure above the wafer 120 and the pressure in the processing chamber 100.

The pressure applied to the top surface 121 of the wafer 120 from the gas streams emitted by the gas distribution assembly 110, in conjunction with the decreased pressure beneath the wafer, may help hold the wafer in place. This may be of particular use in carousel-type processing chambers in which the wafers are offset from and rotated about a central axis. The centrifugal force associated with the rotation of the susceptor assembly can cause the wafer to slide away from the central axis. The pressure differential on the top side of the wafer versus the bottom side of the wafer, due to the gas pressure from the gas distribution assembly versus the pressure applied by the vacuum to the back side of the wafer, helps prevent the movement of the wafer. The gas channels of the gas distribution assembly can be controlled simultaneously (e.g., all of the output channels—reactive gases and purge channels—controlled together), in groups (e.g., all of the first reactive gas channels controlled together) or independently (e.g., the left-most channel controlled separately from the adjacent channel, etc.). As used in this specification and the appended claims, the term "output channels" "gas channels", "gas injectors" and the like are used interchangeably to mean a slot, channel or nozzle type opening through which a gas is injected into the processing chamber. In some embodiments, the first reactive gas channel, the second reactive gas channel and the at least one purge gas channel are independently controlled. Independent control may be useful to provide a positive pressure on the top surface of the wafer positioned in the recess of the susceptor assembly. In some embodiments, each individual first reactive gas injector, second reactive gas injector, purge gas injector and pump channel can be individually and independently controlled.

The pressure differential between the top surface of the wafer and the bottom surface of the wafer can be adjusted by changing, for example, the pressure of the gases from the gas distribution assembly, the flow rate of the gases from the gas distribution assembly, the distance between the gas distribution assembly and the wafer or susceptor surface and the vacuum pressure applied beneath the wafer. As used in this specification and the appended claims, the differential pressure is a measure of the pressure above the wafer vs. the pressure below the wafer. The pressure above the wafer is the pressure applied to the wafer surface or the pressure in the reaction region 102 of the processing chamber 100. The pressure below the wafer is the pressure in the recess, the pressure on the bottom surface of the vacuum pressure in the susceptor assembly 130. The magnitude of the pressure differential can directly affect the degree to which the wafer is chucked. In some embodiments, the pressure differential between the top surface 121 of the wafer 120 and the bottom surface 123 of a wafer 120 is greater than about 15 torr, or greater than about 10 torr, or greater than about 5 torr. In one or more embodiments, the differential pressure between the top surface 121 of the wafer 120 and the pressure in the recess 133 equates to a chucking force large enough to hold a 300 mm wafer at a bolt center radius of about 320 mm at a rotational speed of about 200 rpm.

In some embodiments, as shown in FIG. 1, the processing chamber 100 includes a heating assembly 150. The heating assembly can be positioned in any suitable location within the processing chamber including, but not limited to, below the susceptor assembly 130 and/or on the opposite side of the susceptor assembly 130 than the gas distribution assembly 110. The heating assembly 150 provides sufficient heat to the processing chamber to elevate the temperature of the wafer 120 to temperatures useful in the process. Suitable heating assemblies include, but are not limited to, resistive heaters and radiant heaters (e.g., a plurality of lamps) which direct radiant energy toward the bottom surface of the susceptor assembly 130. The heating assembly 150 of some embodiments, heats the susceptor, which in turn heats the wafers.

The distance between the gas distribution assembly 110 and the top surface 121 of the wafer 120 can be tuned and may have an impact on the pressure differential and the efficiency of the gas flows from the gas distribution assembly. If the distance is too large, the gas flows could diffuse outward before encountering the surface of the wafer, resulting in a lower pressure differential and less efficient atomic layer deposition reaction. If the distance is too small, the gas flows may not be able to flow across the surface to the vacuum ports of the gas distribution assembly and may result in a large pressure differential. In some embodiments, the gap between the surface of the wafer and the gas distribution assembly is in the range of about 0.5 mm to about 2.0 mm, or in the range of about 0.7 mm to about 1.5 mm, or in the range of about 0.9 mm to about 1.1 mm, or about 1.0 mm.

The recess 133 shown in FIG. 1 supports the wafer 120 about an outer peripheral edge 122 of the wafer 120. Depending on the thickness, stiffness and/or vacuum pressure in the recess 133, this arrangement can result in the successful chucking of the wafer, thereby preventing movement of the wafer during rotation or movement of the susceptor assembly 130. However, if the wafer is not thick or stiff, or the vacuum pressure in the recess 133 is too low, the wafer 120 may deflect so that the center portion of the wafer is further away from the gas distribution assembly 110 than the outer peripheral edge 122 of the wafer 120.

Figure 3:
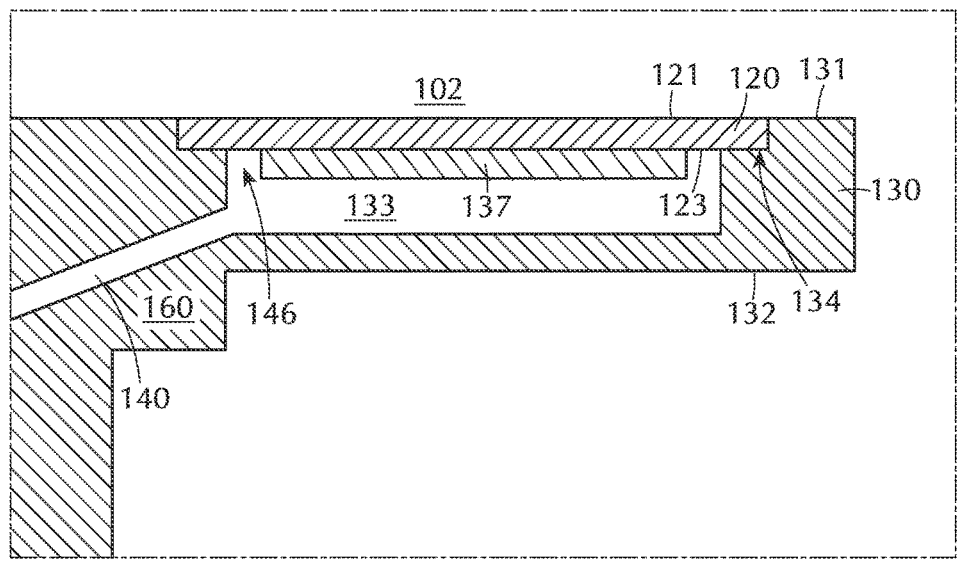
FIG. 3 shows a partial cross-sectional view of a processing chamber in accordance with one or more embodiment of the disclosure.

FIG. 3 shows another embodiment which helps prevent deflection of the wafer by providing a greater support surface area. Here, the wafer 120 is supported across a majority of the back surface 123 by the susceptor 130. This Figure shows a cross-section of the susceptor assembly. The center portion 137 of the susceptor assembly 130 is not free floating, but is connected to the remainder of the susceptor in a different plane than the cross-sectional view. The passage 140 extends from the drive shaft 160, or from a cavity 161 within the drive shaft 160 toward the recess 133. The passage 140 connects to a channel 146 which extends toward the top surface 131 of the susceptor assembly 130. The vacuum chucks the wafer 120 to the susceptor assembly 130 by the vacuum through the channel 146 and passage 140.

Figure 4:
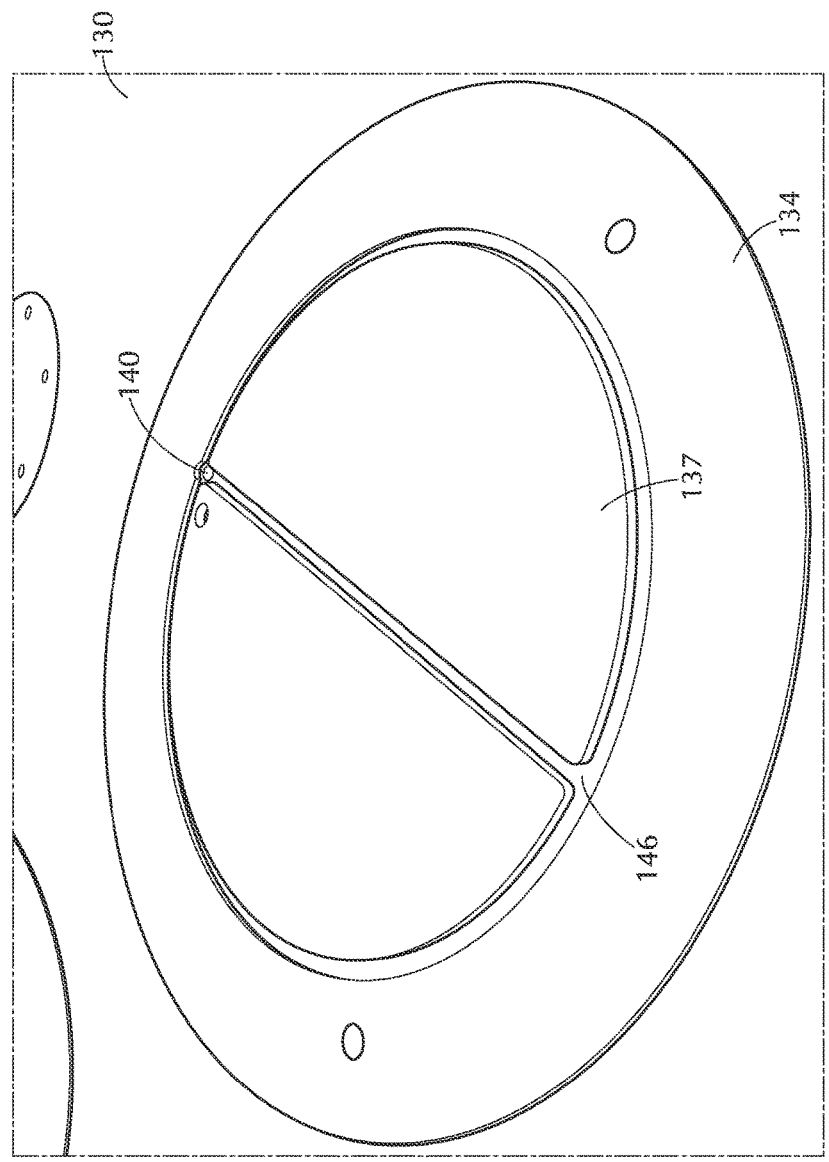
FIG. 4 shows a perspective view of a recess in a susceptor assembly with vacuum passages visible in accordance with one or more embodiment of the disclosure.

FIG. 4 shows a perspective view of a susceptor assembly 130 similar to that of FIG. 3. The susceptor assembly 130 shown has a recess 133 with a relatively large step 134 to support the outer peripheral edge 122 of the wafer (not shown). The recess 133 includes a large passage 140 connects the channel 146 to the vacuum in the drive shaft. The channel shown is shaped like a capital theta, providing a channel ring with a channel portion extending across the diameter of the ring. The center portion 137 of the susceptor assembly 130 is about coplanar with the step 134 so that the center portion 137 and the step 134 support the wafer at the same time.

Figure 5:
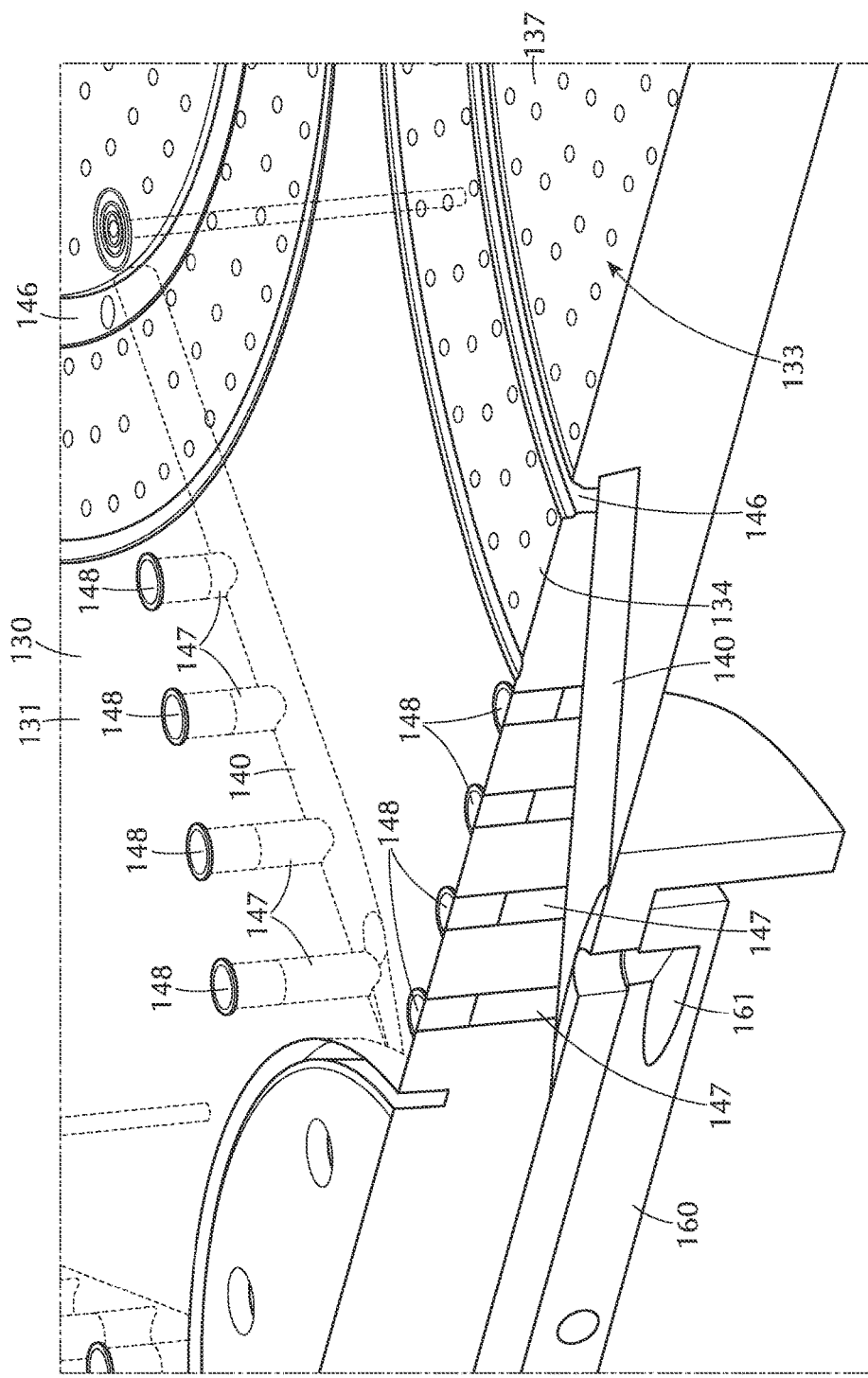
FIG. 5 shows a cross-sectional perspective view of a susceptor assembly in accordance with one or more embodiment of the disclosure.

FIG. 5 shows a perspective view of a susceptor assembly 130 in accordance with one or more embodiments of the invention. Here the passage 140 extends from drive shaft 160 toward the recess 133 connecting the cavity 161, which acts as a vacuum plenum, with the channel 146 in the recess. The passage 140 has a plurality of holes 147 connecting the top surface 131 of the susceptor assembly 130 with the passage 140. In some embodiments, there is at least one hole extending from one of the top surface 131 of the susceptor assembly 130 and the bottom surface 132 of the susceptor assembly 130 to the passage 140. These holes 147 can be created (e.g., drilled) during the manufacture of the susceptor assembly to allow the inside of the passage 140 to be coated. For example, in some embodiments, the susceptor assembly 130 has a silicon carbide coating. The susceptor assembly of some embodiments comprises silicon carbide coated graphite. The holes 147 allow the silicon carbide to be coated on the passage 140 and are then sealed with plugs 148. The plugs can be made of any suitable material including, but not limited to, silicon carbide, silicon carbide coated graphite, a material with a silicon carbide coating and graphite. After the plugs 148 have been inserted into the holes 147, the susceptor assembly can be coated with silicon carbide again to provide an additional sealing of the holes 147. The plugs 148 can be press-fit (e.g., friction fit), connected to the holes 147 by complementary screw threads or connected by some other mechanical connection (e.g., epoxy).

During the preparation of, for example, a silicon carbide coated susceptor assembly 130, the holes 147 provide a useful passageway for the silicon carbide to coat the passage 140. The size and spacing of the holes 147 may have an impact on the efficiency of the coating. The holes 147 can be spaced in increments of the hole diameter. For example, if the holes are 5 mm in diameter, the spacing might be 5x mm, with x being any suitable value. For example, the spacing may be 1, 2, 3, 4, 5, 6, 7, 8, 9 or 10 times the hole diameter. The holes 147 can be positioned at any suitable points along the length of the passage 140, and can but do not need to be evenly distributed across the passage 140 length. As shown in FIG. 5, the holes 147 are concentrated toward the inner portion of the susceptor assembly 130, where the passage 140 is furthest from the top surface 131 of the susceptor assembly 130.

Figure 6:
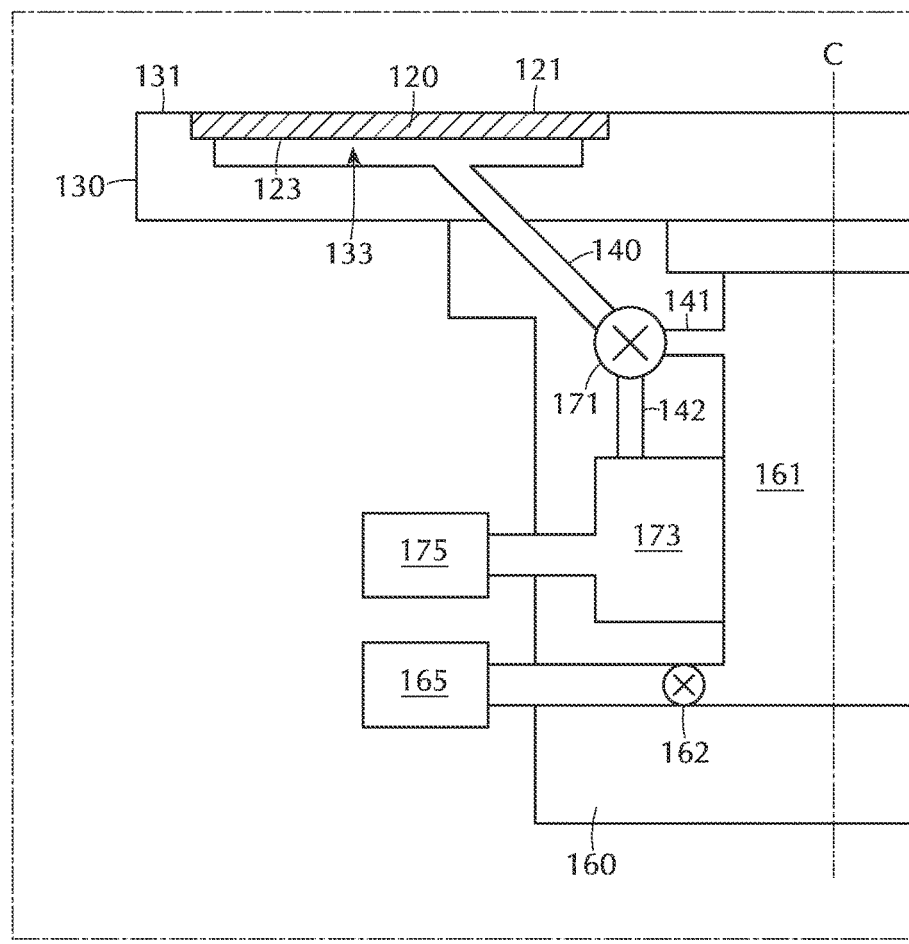
FIG. 6 shows a partial cross-sectional view of a susceptor assembly in accordance with one or more embodiment of the disclosure.

The passages 140 can be used to supply a vacuum to the recess 133 to chuck the wafer 120. However, when the wafer is processed, the vacuum may be too strong to easily remove the processed wafer from the recess. To ease removal of the wafer, the passages 140 can also be used to provide a flow of gas toward the back side of the wafer 120. Thus providing a positive pressure to the back side of the wafer to allow the wafer to be easily removed from the susceptor assembly. FIG. 6 shows a schematic view of a susceptor assembly in accordance with one or more embodiments of the invention. Here, the recess 133 is connected to the passage 140 which leads to the cavity 161 within the drive shaft. A valve 171 is positioned within the passage 140. The valve 171 can allow a fluid connection between the passage 140 and the cavity 161 through connector 141. If a vacuum, or region of decreased pressure, is formed in the cavity 161, then the valve can connect the cavity 161 to the recess 133 through the connector 141 and passage 140. The valve 171 can be switched to break the fluid connection between the passage 140 and the cavity 161. The valve can be set to a closed position, isolating passage 140, or the valve can be set to a position where a connection is formed between passage 140 and a dechucking gas plenum 173 through connector 142. The dechucking gas plenum 173 is shown in fluid communication with a dechucking gas source 175. The dechucking gas source 175 can comprise any suitable gas including, but not limited to, nitrogen, argon, helium or an inert gas.

The vacuum source 165 can be connected to the cavity 161 through valve 162. The valve 162 can be used to isolate the cavity 161 from the vacuum source 165 in the event that there is a loss of vacuum from the vacuum source 165. This allows the cavity 161 to act as a vacuum plenum so that the wafers on the susceptor assembly remain chucked until while the vacuum source is being reconnected or repaired.

Each of the individual recesses 133 in the susceptor assembly 130 can include a separate passage 140 and valve 171. This allows each individual recess 133 to be isolated from the vacuum in the cavity 161. For example, a processed wafer 120 can be rotated to the loading/unloading area of the processing chamber. The valve 171 can be closed or switched to the dechucking gas plenum 173 to cause a positive pressure on the back side of the wafer, allowing a robot to pick up the wafer. After picking up the wafer, the valve can close so that the pressure in the recess 133 will be equal to the pressure of the chamber. A new wafer can be placed in the recess and the valve 171 switched back to allow fluid connection with the cavity 161 to chuck the new wafer.

With reference to FIGS. 7-10, some embodiments of the invention are directed to susceptor assemblies. The susceptor assembly has a susceptor body 230 and a top surface 235. There is at least one recess 133 in the susceptor body 230 extending from the top surface into the susceptor body. Each recess 131 has a bottom 135.

Figure 9:
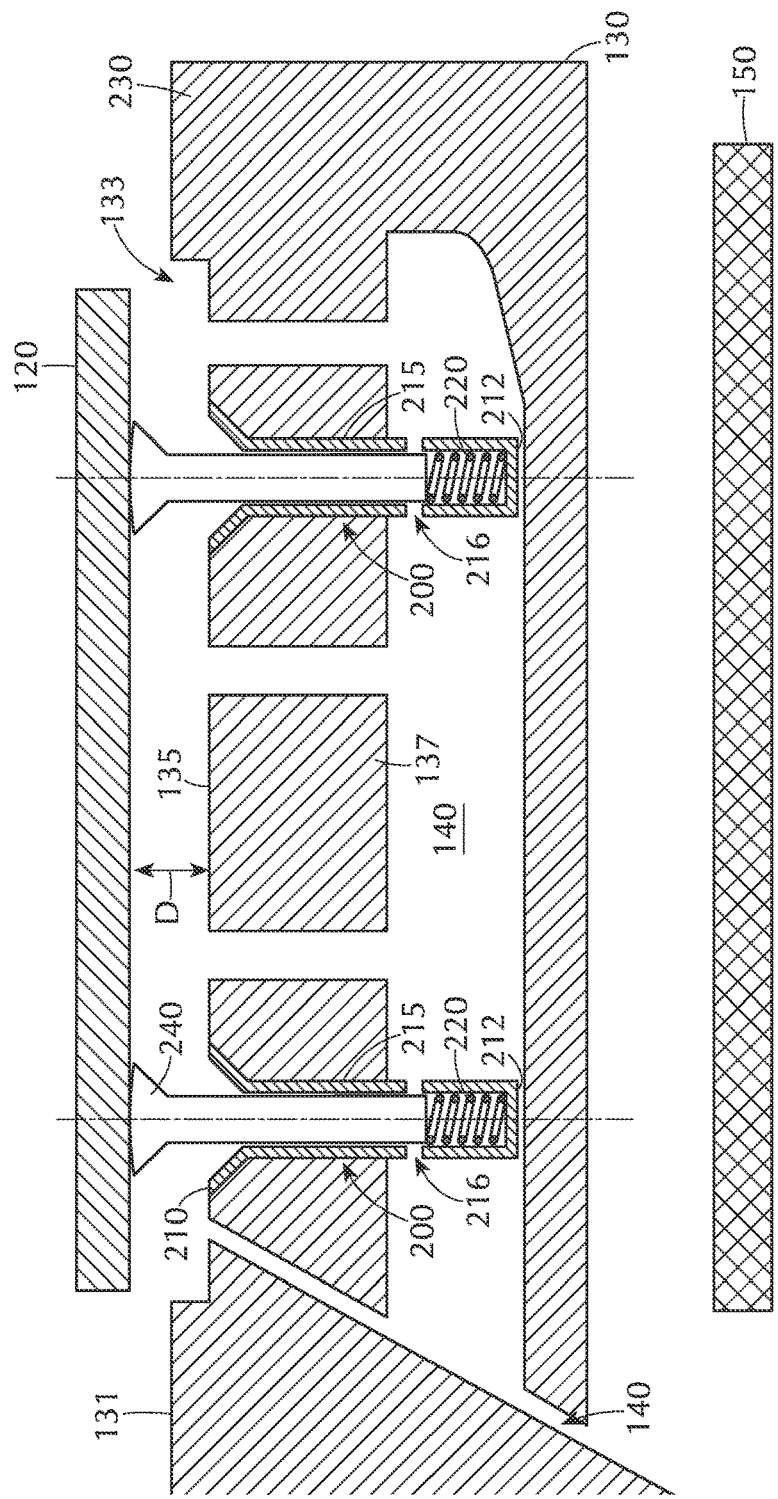
FIG. 9 shows a cross-sectional view of a susceptor assembly with lift pins in accordance with one or more embodiment of the disclosure.

There can be at least three lift pins 200 positioned within holes in each the top surface 235 of the susceptor or in a recess 131 in the susceptor body 230. The lift pins 200 are capable of supporting a planar piece, like a semiconductor wafer 120, and moving the planar piece closer to and further away from the susceptor body 230. FIG. 9 shows only two lift pins 200 because the at least one additional lift pin 200 is not within the cross-section shown.

Each lift pin 200 comprises a sleeve 210, a spring 220 and a pin 240. The sleeve 210 has an elongate body 215 with a top end 211, a bottom 212 and sides 213. The top end 211 of the sleeve 210 shown is open to allow the pin 240, or other components, to move into and out of the sleeve 210. The bottom 212 of the sleeve 210 can be completely solid or can have openings. The elongate axis 214 of the sleeve 210 extends through the bottom 212 and the open top end 211.

Figure 7:
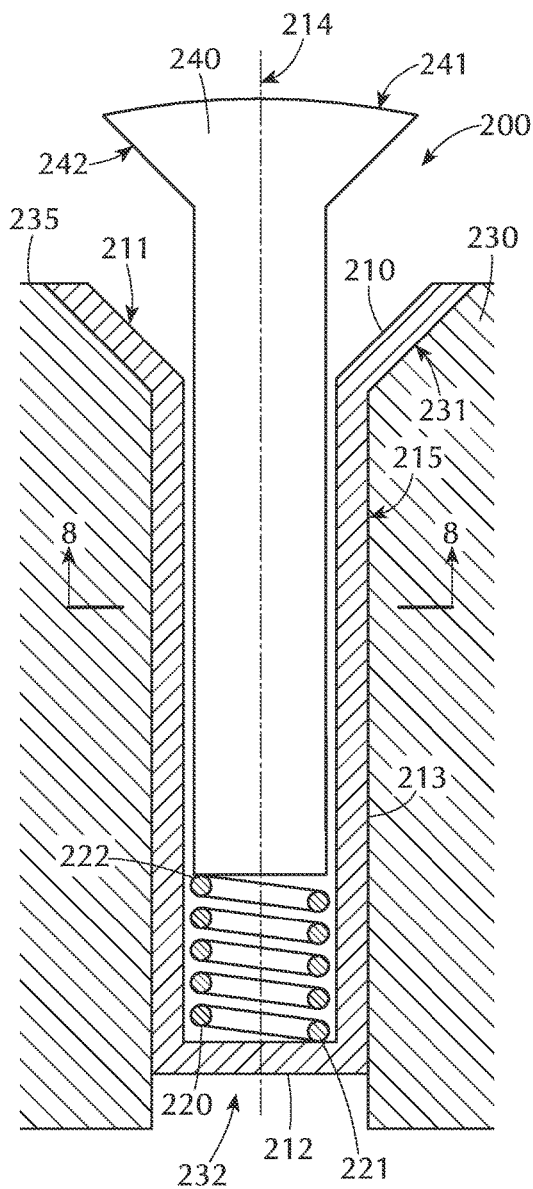
FIG. 7 shows a cross-sectional view of a lift pin in accordance with one or more embodiment of the disclosure.
Figure 8A:
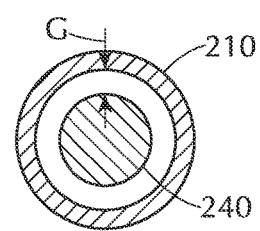
FIGS. 8A and 8B show cross-sectional views of the lift pin taken along plane 8 of FIG. 7.
Figure 8B:
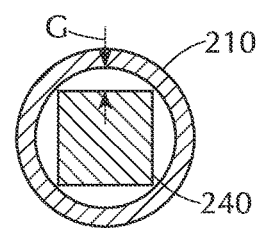

The sleeve 210 can be any suitable shape. For example, the sleeve 210 can be circular, rectangular, pentagonal, hexagonal, heptagonal or octagonal. The cross-sectional shape can be regular or irregular. In one or more embodiment, the cross-sectional shape of the sleeve is circular. The shape of the sleeve refers to the overall impression of the shape when viewed from the side. The sleeve shown in FIG. 7 is considered circular even though the top portion adjacent the open top end 211 flares outwardly. The overall shape, or general shape, of the sleeve 210 and pin 240 are determined without considering a change in diameter or shape adjacent the top, or contact, portion of the pin or sleeve. The sleeve 210 can be made out of any suitable material including, but not limited to, ceramic, aluminum nitride, aluminum oxide and stainless steel.

A spring 220 is positioned within the elongate body 215 of the sleeve 210. The spring 220 is positioned adjacent the bottom 212 of the sleeve 210. The bottom end 221 of the spring 220 contacts the bottom 212 of the sleeve 210, so there is generally some structure to the bottom 212 of the sleeve 210 rather than being merely an open end. As described above, the bottom 212 of the sleeve 210 can be completely solid or can have openings.

A pin 240 is positioned within the elongate sleeve 210 in contact with the top end 222 of the spring 220. The pin 240 is movable along the elongate axis 214 of the sleeve 210 so that a top surface 241 of the pin 240 can extend above the top end 211 of the sleeve 210.

The pin 240 can have the same general shape as that of the sleeve 210 or a different shape that can cooperatively interact with the sleeve. For example, in the embodiment shown in FIG. 8A, the sleeve and pin may both have generally cylindrical shapes. In the embodiment shown in FIG. 8B, the sleeve has a generally cylindrical shape and the pin has a rectangular shape.

The pin 240 can be made from any suitable material that resists reaction with the processing gases being used in the processing chamber and is stable at the temperature employed in the processing chamber. Suitable materials include, but are not limited to, ceramic, aluminum nitride, aluminum oxide and stainless steel. The top surface 241 of the pin 240 can be made of the same material as the pin 240 or can be a different material. For example, the top surface 241 may have a coating or piece of a soft material that can safely contact the wafers without damaging or allowing slippage. The shape of the top surface 241 of the pin 240 can be flat, concave or convex. In some embodiments, the top surface 241 of the pin 240 is slightly convex to minimize the area of the pin 240 that will contact the wafer 120.

The springs 220 of some embodiments have a spring constant sufficient to allows a wafer 120 resting on the pins to be elevated when no vacuum is applied and to contract so that the wafer 120 is resting on the bottom surface 135 of the recess 131 when vacuum is applied. In some embodiments, the spring constant is sufficient to elevate a wafer 120 supported on the pins to a distance D above the bottom surface 135 of the recess 131 by an amount in the range of about 0.5 mm to about 2 mm.

The spring 220 of some embodiments is made from a material comprising a high temperature material. For example, the spring can be made from a material comprising one or more of a ceramic and HASTELLOY® (a registered trademark of Haynes International Inc.). In one or more embodiments, the spring is made from a material comprising up to 3.5 wt % cobalt, in the range of about 1 to about 30 wt % chromium, in the range of about 5 to about 30 wt % molybdenum, up to about 5 wt % tungsten, in the range of about 1 to about 20 wt % iron, up to about 1 wt % silicon, up to about 3 wt % manganese, up to about 0.2 wt % carbon with the balance being at least about 30 wt % nickel. In some embodiments, the material further comprises up to about 0.5 wt % aluminum, up to about 0.7 wt % titanium, up to about 2 wt % copper, up to about 0.6 wt % vanadium or about 0.5 wt % of a combination of aluminum and titanium with 0.35 wt % copper.

In some embodiments, there is a gap G between the outer diameter of the pin 240 and the inner diameter of the sleeve 210. The gap G is defined as the average distance between the pin 240 and sleeve 210 and is independent of the shape of the pin 240 and sleeve 210. For example, circular pins and sleeves may have a more uniform gap at all points around the pin than for a sleeve and pin with different shapes. Stated differently, in some embodiments, there is a gap between the inside surface of the sleeve and the outside surface of the pin. The average gap of some embodiments is in the range of about 0.5 mm to about 0.15 mm. In one or more embodiments, the gap is less than about 0.25 mm, or less than about 0.2 mm or less than about 0.15 mm or less than about 0.1 mm.

The embodiment shown in the Figures has a flared top portion 211 on the sleeve 210 and a flared top portion 242 on the pin 240. The flared top 231 of the opening 232 in the susceptor body 230 may help prevent the sleeve 210 from dropping too far into the opening 232. Additionally, the flared top 242 of the pin 240 may help prevent the pin 240 from dropping too far into the sleeve 210.

FIG. 9 shows an embodiment of the invention in which the sleeve 210 has at least one hole 216 in the elongate body 215. The at least one hole 216 can be in the sides 213 or the bottom 212 of the sleeve 210. The at least one hole 216 may help evacuate gases from the inside of the sleeve 210 upon application of vacuum to the recess. The gases from the gap G can be evacuated from the top portion of the sleeve 210 only or can also be evacuated through the hole 216.

Referring to FIGS. 9 and 10, the use of the susceptor assembly 130 and lift pins 200 are described. The susceptor assembly 130 within the processing chamber 100 is rotated to position one of the recesses 133 adjacent a loading area 260. The vacuum connection to the recess 133 adjacent the loading area 260 is disengaged allowing the springs 220 to expand lifting the wafer 120 out of the recess 133. Disengagement of the vacuum to the recess 133 can be done before, during or after the rotation of the susceptor. As shown in FIG. 9, the wafer 120 is above the top surface 131 of the susceptor assembly 130 where a robot arm (not shown) can be slid beneath the wafer 120 allowing the wafer 120 to be removed from the processing chamber.

A wafer 120 can be positioned on the at least three lift pins 200 located within the recess 133 on the susceptor assembly 130. The heating assembly 150 positioned beneath the susceptor assembly 130 heats the susceptor body 230. The wafer 120 supported on the pins 240 are held at a distance from the susceptor body 230 which allows the wafers 120 to absorb heat from the susceptor body 230. This process is referred to as pre-heating and allows the temperature of the wafer 120 to slowly equilibrate with the temperature of the susceptor body.

The susceptor assembly 130 is rotated to position another recess 133 adjacent the loading area 260. The removal of a wafer at that recess 133 and loading of a new wafer 120 is repeated. The process of rotation, removal of old wafer (if there is one) and placement of a new wafer is repeated until all of the recesses have a new wafer supported on the pins 240 of the lift pins 200.

When a predetermined number of wafers are positioned on the lift pins 200, the vacuum connection to the recesses 133 associated with the wafers is engaged. The vacuum causes the spring 220 to compress so that the pin 240 is lowered within the sleeve 210, allowing the wafer to rest on the bottom 135 of the recess 133. The application of the vacuum to the recess can cause gases to draw out of the gap between the pin 240 and the sleeve 210 and/or through the opening 216 in the side of the sleeve 210, as shown in FIG. 9. It will be understood by those skilled in the art that the opening in the side of the sleeve is not necessary to draw all gases from the lift pins.

The application of the vacuum to the recesses can be sequential or simultaneous. For example, the wafer may be loaded into the process chamber onto the lift pins. After rotation of the susceptor assembly to move a new recess to the loading area, the wafer may have had sufficient time to come to temperature and can be lowered into the recess. In this way, each recess has a separate connection to the vacuum source and can be individually controlled. In some embodiments, all of the wafers are lowered into the recesses by engagement of the vacuum to the recesses at the same time. The first wafer loaded will have had a greater amount of time to equilibrate with the susceptor body temperature than the last wafer loaded. In some embodiments, the last one, two, three, four or all of the wafers are pre-heated before loading into the process chamber.

FIGS. 11A through 11C show another embodiment of the invention in which there is a lift motor 270 connect to the lift pin 200. The lift motor can cause the sleeve 210 to move into and out of the opening 232 in the susceptor body 230. This movement is independent of the compression and expansion of spring 220.

FIG. 11A shows the lift pin 200 in a loading position, which might exist when the recess 133 is adjacent the loading area 260 of the processing station. Here, the lift 270 has elevated the sleeve 210 including spring 220 and pin 240 to a position where a robot (not shown) can easily reach beneath wafer 120 without touching the top surface 131 of the susceptor body 230. Because the spring 220 is not compressed at this point, the pin 240 is elevated out of the sleeve 210.

Once the wafer 120 has been placed onto the lift pins 200, the lift 270 can lower the sleeve 210, including the spring 220 and pin 240 to a pre-heating position. This pre-heating position is shown in FIG. 11B. Here, the flared portion of the top of the sleeve 210 is positioned within the opening 232 in the susceptor body 230. The spring is still in the expanded form and the wafer 120 remains elevated above the bottom 135 of the recess 133. FIG. 11B shows the lift 270 in contact with the bottom of the sleeve 210. The lift 270 can continue to lower after the sleeve 210 is seated in the opening in the susceptor body so that the lift 270 is no longer in contact with the sleeve.

Once the wafer 120 has been sufficiently pre-heated, the vacuum connection to the recess 133 through the passage 140 can be engaged. This causes the gases in the gap between the pin 240 and the sleeve 210 to be evacuated and the spring 220 to compress. Upon compression, the pin 240 lowers into the sleeve 210 so that the wafer 120 rests on the bottom 135 of the recess 133. This is a processing position shown in FIG. 11C. The lift 270 has lowered and is no longer in contact with the sleeve 210.

Substrates for use with the embodiments of the invention can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor wafer, such as a 200 mm or 300 mm diameter silicon wafer.

As used in this specification and the appended claims, the terms "reactive gas", "reactive precursor", "first precursor", "second precursor" and the like, refer to gases and gaseous species capable of reacting with a substrate surface or a layer on the substrate surface.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, plasmas may not be requisite. Indeed, other embodiments relate to deposition processes under very mild conditions without plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and equivalents.

What is claimed is:

1. A susceptor assembly, comprising:
    a susceptor having a susceptor body and a top surface with at least one recess therein sized to enclose a wafer during processing, each recess having a bottom surface with at least three flared openings; and
    at least three lift pins positioned within each recess, each lift pin positioned within one of the at least three flared openings in the bottom surface of the recess, each lift pin comprising a sleeve having an elongate body with a flared top end, bottom, sides and an elongate axis, the sleeve movable within the recess along the elongate axis so that the flared top end of the sleeve can extend above the bottom surface of the recess, a spring within the elongate body of the sleeve adjacent the bottom of the sleeve and a pin positioned within the elongate sleeve in contact with the spring, the pin having a flared top portion and movable along the elongate axis of the sleeve so that a top surface of the pin can extend above the flared top end of the sleeve.

2. The susceptor assembly of claim 1, wherein the sleeve comprises at least one hole in the elongate body positioned between the flared top end and the bottom.

3. The susceptor assembly of claim 1, wherein the elongate body of the sleeve is cylindrical.

4. The susceptor assembly of claim 1, wherein there is a gap between an inside surface of the sleeve and an outside surface of the pin.

5. The susceptor assembly of claim 4, wherein the gap is in the range of about 0.05 mm to about 0.15 mm.

6. The susceptor assembly of claim 1, wherein the springs in the at least three lift pins have spring constant sufficient to allows a wafer resting on the pins to be elevated when no vacuum is applied and to contract so that the wafer is resting on the bottom surface of the recess when vacuum is applied.

7. The susceptor assembly of claim 6, wherein when no vacuum is applied, the spring constant is sufficient to elevate a wafer supported on the pins to a distance above the bottom surface of the recess by an amount in the range of about 0.5 mm to about 2 mm.

8. The susceptor assembly of claim 6, wherein the spring is made from a high temperature material.

9. The susceptor assembly of claim 8, wherein the spring is made from a material comprising one or more of a ceramic and a material comprising up to 3.5 wt % cobalt, in the range of about 1 to about 30 wt % chromium, in the range of about 5 to about 30 wt % molybdenum, up to about 5 wt % tungsten, in the range of about 1 to about 20 wt % iron, up to about 1 wt % silicon, up to about 3 wt % manganese, up to about 0.2 wt % carbon with the balance being at least about 30 wt % nickel.

10. The susceptor assembly of claim 1, further comprising a lift motor to move the sleeve into and out of the opening.

11. A susceptor assembly, comprising:
   a susceptor having a susceptor body and a top surface with at least one recess therein sized to enclose a wafer during processing, each recess having a bottom surface with at least three flared openings;
   at least three lift pins positioned within each recess, each lift pin positioned within one of the at least three flared openings, each lift pin comprising,
      a cylindrical sleeve having an elongate body with a flared top end, bottom, sides and an elongate axis, each of the cylindrical sleeves positioned within the openings in bottom surface of the recess and movable into and out of the opening,
      a spring comprising a high temperature material positioned within the elongate body of the cylindrical sleeve adjacent the bottom of the cylindrical sleeve, and
      a cylindrical pin positioned within the elongate cylindrical sleeve in contact with the spring, the cylindrical pin having a flared top portion, an outer diameter that is smaller than an inner diameter of the elongate cylindrical sleeve and forming a gap between the cylindrical pin and the cylindrical sleeve, the cylindrical pin movable along the elongate axis of the cylindrical sleeve so that a top surface of the cylindrical pin can extend above the flared top end of the cylindrical sleeve,
   wherein the spring has a spring constant sufficient to allow a wafer resting on the cylindrical pin to be elevated when no vacuum is applied and to contract so that the wafer rests on the bottom surface of the recess when a vacuum is applied; and
   a vacuum source in fluid communication with the recess in the susceptor.

12. The susceptor assembly of claim 11, wherein the sleeve comprises at least one hole in the elongate body positioned between the flared top end and the bottom.

13. The susceptor assembly of claim 11, wherein the gap is in the range of about 0.05 mm to about 0.15 mm.

14. The susceptor assembly of claim 11, wherein when no vacuum is applied, the spring constant is sufficient to elevate a wafer supported on the pins to a distance above the bottom surface of the recess by an amount in the range of about 0.5 mm to about 2 mm.

15. The susceptor assembly of claim 11 wherein the spring is made from a material comprising one or more of a ceramic and a material comprising up to 3.5 wt % cobalt, in the range of about 1 to about 30 wt % chromium, in the range of about 5 to about 30 wt % molybdenum, up to about 5 wt % tungsten, in the range of about 1 to about 20 wt % iron, up to about 1 wt % silicon, up to about 3 wt % manganese, up to about 0.2 wt % carbon with the balance being at least about 30 wt % nickel.

16. The susceptor assembly of claim 11, further comprising a lift motor to move the sleeve into and out of the opening.

* * * * *